United States Patent
Kotani et al.

(10) Patent No.: US 7,594,216 B2
(45) Date of Patent: Sep. 22, 2009

(54) METHOD AND SYSTEM FOR FORMING A MASK PATTERN, METHOD OF MANUFACTURING A SEMICONDUCTOR DEVICE, SYSTEM FORMING A MASK PATTERN ON DATA, CELL LIBRARY AND METHOD OF FORMING A PHOTOMASK

(75) Inventors: Toshiya Kotani, Machida (JP); Satoshi Tanaka, Kawasaki (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 811 days.

(21) Appl. No.: 10/933,334

(22) Filed: Sep. 3, 2004

(65) Prior Publication Data
US 2005/0064302 A1 Mar. 24, 2005

(30) Foreign Application Priority Data
Sep. 4, 2003 (JP) ............... 2003-312745

(51) Int. Cl.
*G06F 17/50* (2006.01)
(52) U.S. Cl. .............. 716/21; 430/5; 430/311; 430/394
(58) Field of Classification Search .......... 430/5, 430/311; 716/19, 21
See application file for complete search history.

(56) References Cited

U.S. PATENT DOCUMENTS

| | | | |
|---|---|---|---|
| 5,847,421 A | 12/1998 | Yamaguchi | |
| 5,879,844 A | 3/1999 | Yamamoto et al. | |
| 6,425,117 B1 * | 7/2002 | Pasch et al. | 716/21 |
| 6,548,312 B1 * | 4/2003 | Hayano et al. | 438/5 |
| 2002/0045110 A1 * | 4/2002 | Ohnuma | 430/5 |
| 2002/0094483 A1 * | 7/2002 | Hattori et al. | 430/5 |
| 2003/0039898 A1 * | 2/2003 | Aton et al. | 430/5 |
| 2003/0059685 A1 * | 3/2003 | Ohsaka | 430/5 |
| 2003/0073010 A1 * | 4/2003 | Narukawa et al. | 430/5 |
| 2003/0087193 A1 * | 5/2003 | Okada et al. | 430/311 |

FOREIGN PATENT DOCUMENTS

JP 8-272075 10/1996

(Continued)

OTHER PUBLICATIONS

Taiwanese Office Action dated Nov. 9, 2005.

*Primary Examiner*—Mark F Huff
*Assistant Examiner*—Rashid Alam
(74) *Attorney, Agent, or Firm*—Finnegan, Henderson, Farabow, Garrett & Dunner, L.L.P.

(57) ABSTRACT

A method of forming a mask pattern comprises the following steps. A second cell library is prepared by making process proximity effect correction with respect to cell patterns stored in a first cell library. The second cell library stores corrected cell patterns. A first corrected cell pattern and a second corrected cell pattern of the corrected cell patterns are placed so that an edge of the first corrected cell pattern and an edge of the second corrected cell pattern contact or come close to or overlap each other. A boundary pattern at the boundary neighborhood between the first corrected cell pattern and the second corrected cell pattern is extracted. Process proximity effect correction is made with respect to the boundary pattern.

13 Claims, 7 Drawing Sheets

FOREIGN PATENT DOCUMENTS

| | | |
|---|---|---|
| JP | 9-319067 | 12/1997 |
| JP | 10-32253 | 2/1998 |
| JP | 2002-328460 | 11/2002 |
| JP | 2002-333700 | 11/2002 |
| TW | 539913 | 7/2003 |
| TW | 550689 | 9/2003 |

* cited by examiner

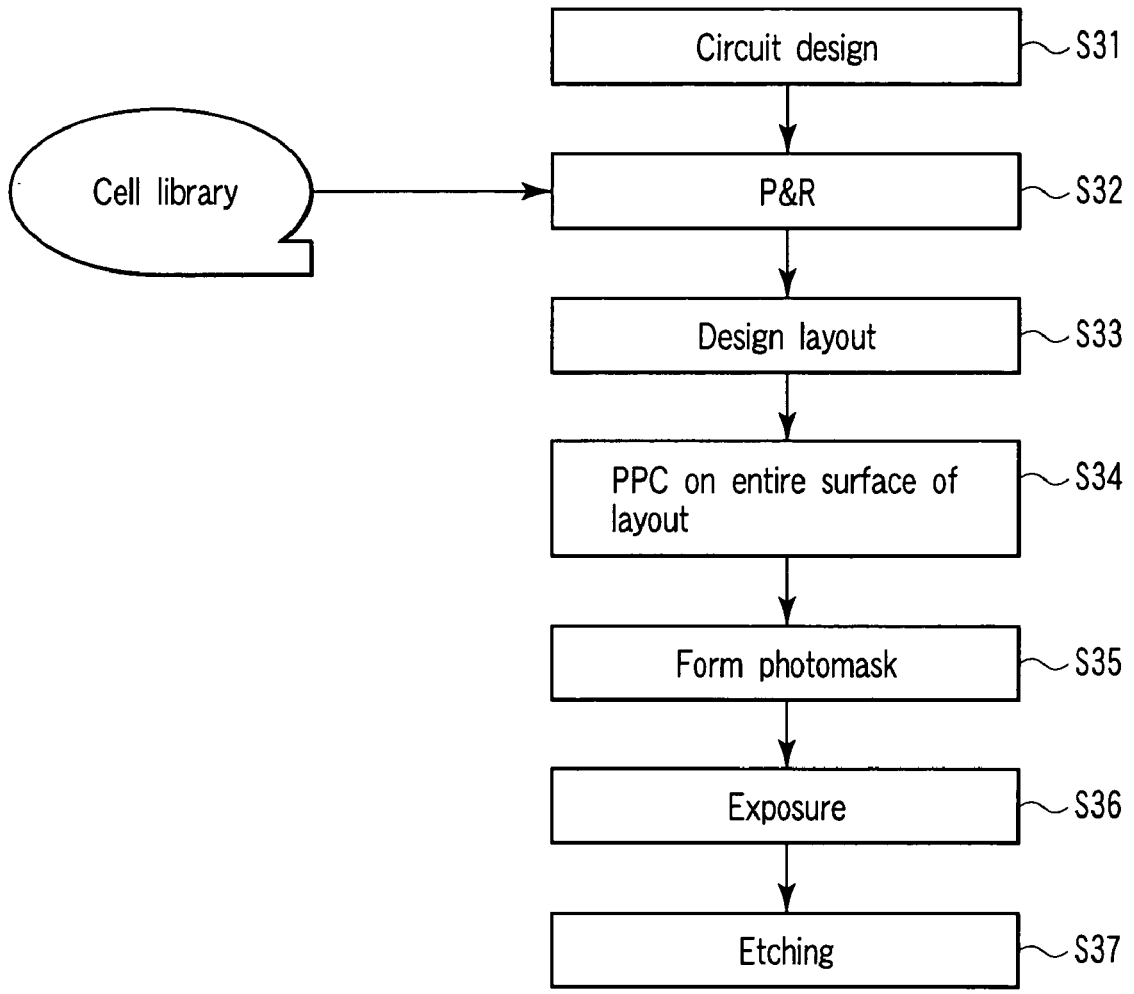
F I G. 1 1 (PRIOR ART)

METHOD AND SYSTEM FOR FORMING A MASK PATTERN, METHOD OF MANUFACTURING A SEMICONDUCTOR DEVICE, SYSTEM FORMING A MASK PATTERN ON DATA, CELL LIBRARY AND METHOD OF FORMING A PHOTOMASK

CROSS-REFERENCE TO RELATED APPLICATIONS

This application is based upon and claims the benefit of priority from prior Japanese Patent Application No. 2003-312745, filed Sep. 4, 2003, the entire contents of which are incorporated herein by reference.

BACKGROUND OF THE INVENTION

1. Field of the Invention

The present invention relates to a method of forming a mask pattern, a method of manufacturing a semiconductor device, a system forming a mask pattern on data, a cell library and a method of forming a photomask. Specifically, the present invention relates to a mask pattern for forming a photomask used for logic devices (application specific integrated circuits [ASICs], in particular).

2. Description of the Related Art

FIG. 11 shows the flow after the layout design of a logic device such as an ASIC. Circuit design (step S31) is completed, and thereafter, a photomask having a pattern for realizing the designed circuit is formed. More specifically, cell patterns are successively selected from a cell library on data via an automatic placement and routing (P&R) process, and then, placed on a chip (step S32). The cell patterns are each composed of several patterns for realizing individual circuit characteristics (e.g., NAND gates and OR gates, etc.). Patterns for connecting the placed cell patterns are added, and thereby, the layout is completed (step S33).

Process proximity effect correction (PPC) is made with respect to all patterns in the layout (step S34). The PPC is made in order to solve the problem that the formed pattern does not have the dimensions according to the design due to the scale down of patterns. In other words, the dimensions of a certain pattern receive an influence by other patterns around there in lithography and etching processes. For this reason, an auxiliary pattern is previously added to the design pattern so that the etched pattern has the same dimensions as the design, or the design pattern dimensions are corrected. The process proximity effect correction includes corrections on the dimensional difference occurring in etching between the design pattern and the formed pattern, and optical proximity effect correction (OPC). The foregoing technique is disclosed in JPN. PAT. APPLN. KOKAI Publication No. 09-319067. The PPC is made, and thereafter, a mask pattern is completed.

The resultant mask pattern is used to form photomask (step S35), and resist having the pattern of the photomask is formed (step S36), and thereafter, etching is carried out using the resist (step S37).

The foregoing PPC is made with respect to each pattern based on designed circuit information after all cell patterns are placed. Thus, highly accurate correction is possible; however, much time is spent for the PPC. In order to achieve high-speed PPC, the following technique is disclosed in JPN. PAT. APPLN. KOKAI Publications No. 8-272075 (first prior art) and 10-32253 (second prior art). According to the disclosed technique, the PPC is made with respect to each cell pattern included in a cell library. Since cell patterns subjected to the PPC are placed, the PPC time is considerably shortened compared with the case where PPC is made after cell patterns are placed.

However, the prior arts described above have the problem when the cell patterns subjected to the PPC are placed on a chip. More specifically, even if the PPC is made with respect to individual cell patterns, adjacent cell patterns are affected by optical proximity effect when these cell patterns are placed. As a result, desired dimensional accuracy is not secured at the boundary portion between cell patterns. In order to solve the problem, the following methods are employed. One is a method (Publication No. 8-272075) of placing cell patterns with a space between adjacent two of them when cell patterns are placed. Another is a method (Publication No. 10-32253) of interposing a dummy pattern between cell patterns when placing the cell patterns. However, if the methods are applied to all cell patterns, the area of the photomask increases, leading larger chip area.

BRIEF SUMMARY OF THE INVENTION

According to a first aspect of the present invention, there is provided a method of forming a mask pattern on data, comprising: preparing a second cell library by making process proximity effect correction with respect to cell patterns stored in a first cell library, the second cell library storing corrected cell patterns; placing a first corrected cell pattern and a second corrected cell pattern of the corrected cell patterns so that an edge of the first corrected cell pattern and an edge of the second corrected cell pattern contact or come close to or overlap each other; extracting a boundary pattern at the boundary neighborhood between the first corrected cell pattern and the second corrected cell pattern; and making process proximity effect correction with respect to the boundary pattern.

According to a second aspect of the present invention, there is provided a system forming a mask pattern on data, comprising: a pattern select section selecting a selected cell pattern from cell patterns stored in a first library; a dummy pattern generation section placing a dummy pattern outside the selected cell pattern, thereby forming a provisional cell pattern; a first process proximity effect correction section making process proximity effect correction with respect to the provisional cell pattern, thereby forming a corrected provisional cell pattern; a pattern removal section removing the dummy pattern from the corrected provisional cell pattern, thereby preparing a corrected cell pattern; a placement and routing section placing a first corrected cell pattern and a second corrected cell pattern included in a second library storing a plurality of the corrected cell patterns so that an edge of the first corrected cell pattern and an edge of the second corrected cell pattern contact or come close to or overlap each other; a boundary extraction section extracting a boundary pattern at the boundary neighborhood between the first corrected cell pattern and the second corrected cell pattern; and a second process proximity effect correction section making process proximity effect correction with respect to the boundary pattern.

According to a third aspect of the present invention, there is provided a cell library comprising: data of cell patterns, the cell patterns including corrected patterns, the corrected patterns being obtained by making process proximity effect correction to a pattern having a shape to be transferred to a photomask, the corrected patterns having a shape corresponding to the result of process proximity effect correction considering an influence by a dummy pattern provisionally placed outside the cell pattern.

BRIEF DESCRIPTION OF THE SEVERAL VIEWS OF THE DRAWING

FIG. 11 is a flowchart to explain the flow after the layout design of a logic device.

DETAILED DESCRIPTION OF THE INVENTION

Figure 1:
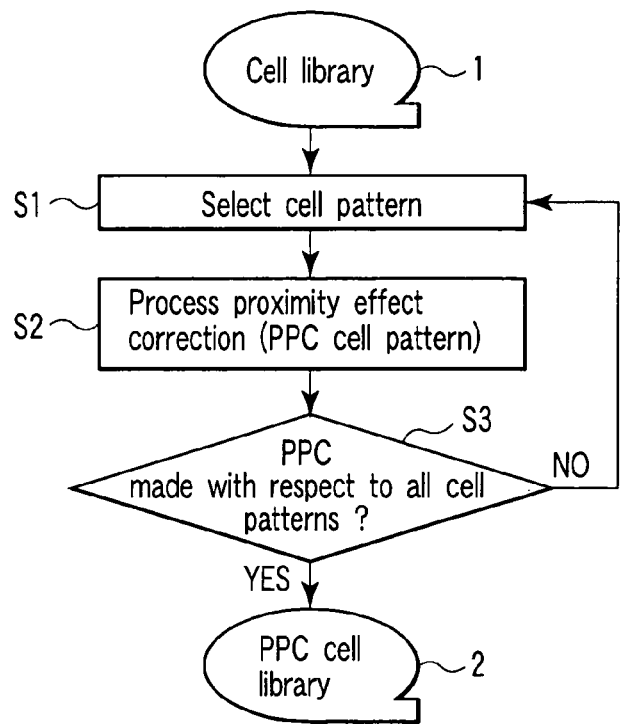
FIG. 1 is a flowchart to explain the procedure (method) of preparing a cell library having cell patterns subjected to PPC.

Embodiments of the present invention will be described below with reference to the accompanying drawings. In the following description, the same reference numerals are used to designate components having an identical function and configuration, and repeated explanation will be given as the need arises.

(First Embodiment)

As referred to the cell library in the background technique, the procedure of making PPC with respect to cell patterns included in the cell library to prepare a new cell library on data will firstly be explained below. FIG. 1 is a flowchart to explain the method of preparing a new cell library having cell patterns by executing PPC to cell patterns in a cell library. As shown in FIG. 1, a first cell pattern is selected from a cell library 1 (first cell library)(step S1). The cell library 1 stores cell patterns. The cell patterns are each composed of several patterns for realizing individual circuit characteristics (e.g., NAND gates and OR gates, etc.).

Figure 2:
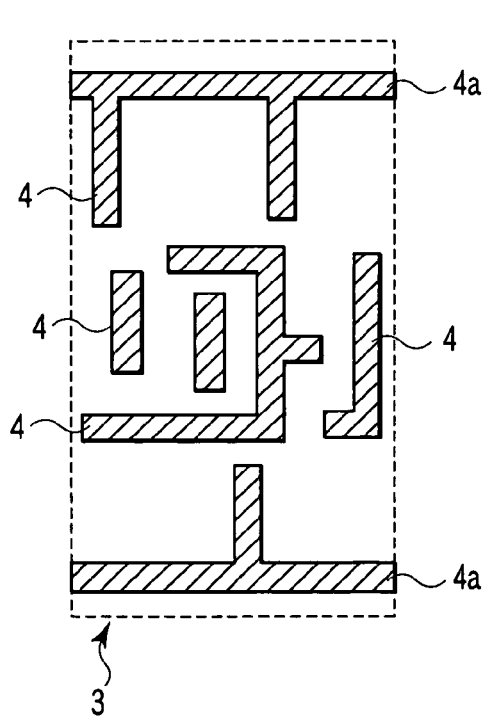
FIG. 2 is a view showing one example of a cell pattern.

In FIG. 2, there is shown a cell pattern 3 of a metal interconnection layer as one example of the cell pattern. As illustrated in FIG. 2, the cell pattern 3 has several patterns 4. Typically, the cell pattern 3 of the metal interconnection layer has power line patterns 4a, which horizontally extend at its upper and lower portions.

Then, the PPC is made with respect to the selected cell pattern according to a known method using computers and tools available on the market (step S2). In the following, the PPC includes corrections on the dimensional difference occurring in etching between the design pattern and the formed pattern, and optical proximity effect correction (OPC). The cell pattern that underwent the PPC is stored in a PPC cell library 2 (second cell library).

Figure 3:
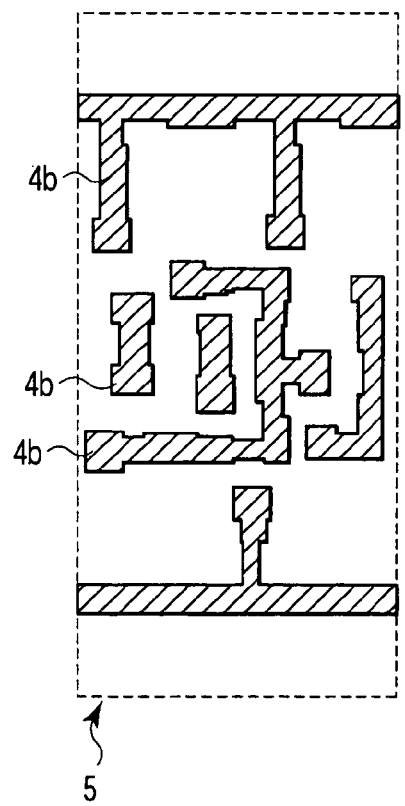
FIG. 3 is a view showing one example of a corrected cell pattern.

FIG. 3 shows one example (corrected cell pattern 5) of the cell pattern after the PPC. As depicted in FIG. 3, the PPC is made; as a result, the line width of a corrected pattern 4b increases. Further, the line width of the line end portion of the corrected pattern 4b largely increases in the line extending direction. Further, pattern is added to the interior angle portion of the corner of the corrected pattern 4b. When a photomask is formed using the corrected cell pattern 5, the pattern shape of the completed photomask approaches the designed shape (shape shown in FIG. 2).

It is determined whether or not the PPC is made with respect to all cell patterns 3 (step S3). If the PPC with respect to all cell patterns 3 is not completed, the operations of steps S1 and S2 are repeated. The operations of steps S1 and S2 are repeated; as a result, it is determined in step S3 that the PPC with respect to all cell patterns 3 is completed, the operation of preparing the PPC cell library 2 ends.

Figure 4:
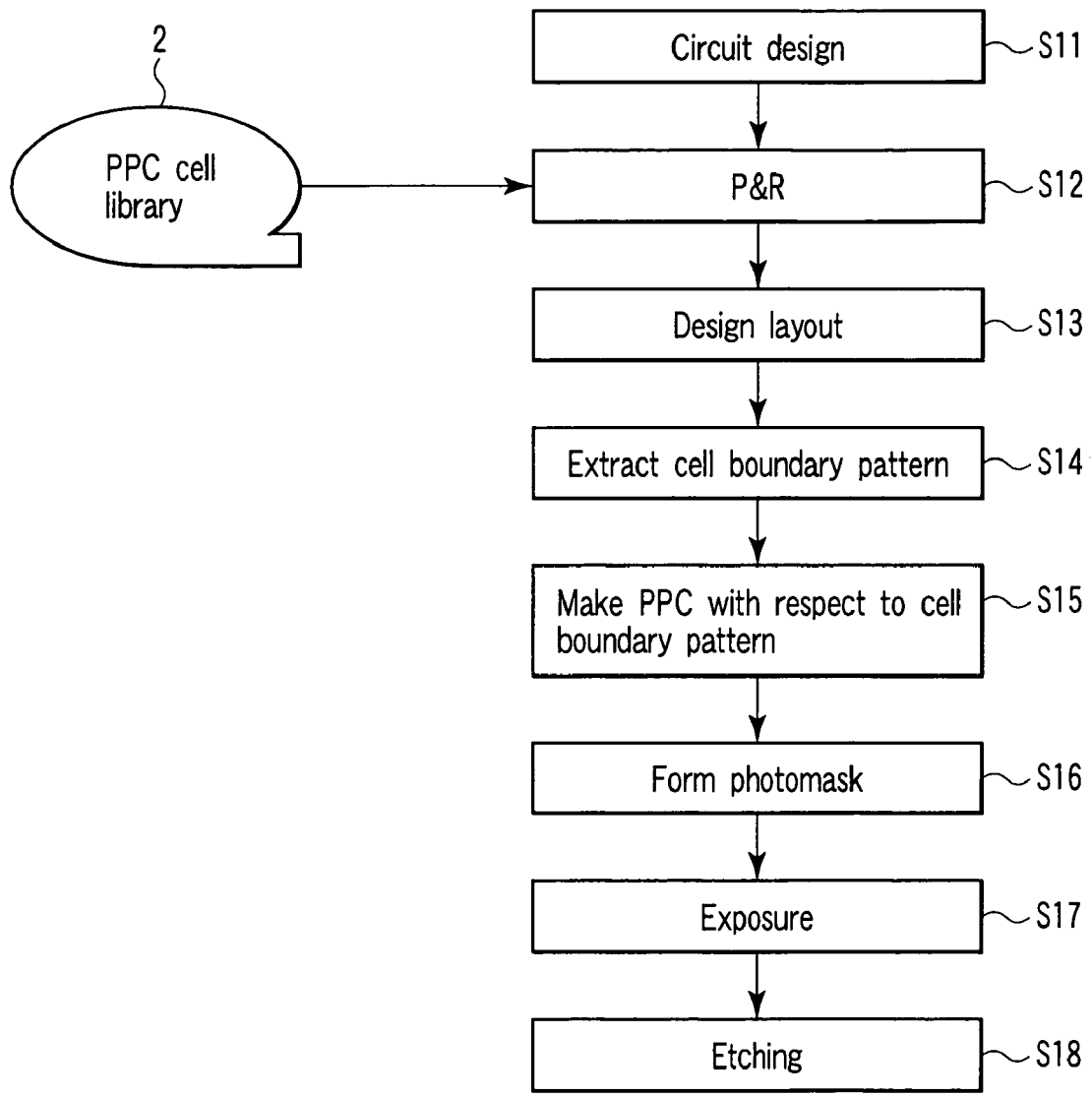
FIG. 4 is a flowchart to explain the method of forming a photomask according to a first embodiment of the present invention.

The following are descriptions on the method of forming a photomask using the PPC cell library 2 and the method of processing a film to be processed using the photomask. FIG. 4 is a flowchart to explain the method of forming a photomask according to the first embodiment of the present invention. As shown in FIG. 4, circuit design is made to realize a desired operation (step S11). In the automatic placement and routing process, corrected cell patterns 5 are successively selected from the PPC cell library 2, and placed on a chip to realize the designed circuit (step S12). In this process, the corrected cell patterns 5 are placed so that their edges mutually contact or come close or overlap. Interconnection pattern is formed based on the electrical connection relationship between placed corrected cell patterns, and thereby, layout is completed (step S13).

The pattern 4b positioned on the boundary neighborhood of each corrected cell pattern 5 is extracted (step S14). The boundary neighborhood means to include a range from the edge of the corrected cell pattern 5 to portions affected by optical proximity effect from the adjacent cell pattern 5, as shown in FIG. 3.

The PPC is made with respect to the pattern 4b of the extracted boundary neighborhood, and thereby, a mask pattern (mask pattern data) is completed (step S15). As described above, even if the layout is made using the corrected cell pattern 5, the boundary neighborhood pattern 4b is affected by optical proximity effect because corrected cell patterns 5 are adjacent to each other. For this reason, the PPC is further made with respect to the boundary neighborhood pattern 4b of each corrected cell pattern 5. As a result, the dimensions of the photomask formed using the corrected cell pattern 5 approach the designed dimensions.

As described above, the boundary neighborhood means a range from the end portion of the corrected cell pattern 5 to portions affected by optical proximity effect from the adjacent cell pattern 5. This is based on the following reason. If the pattern 4b of the corrected cell pattern 5 placed adjacent to a certain corrected cell pattern 5 is out of the foregoing range, the pattern of the object corrected cell pattern 5 is not affected by optical proximity effect. Thus, correction is again made with respect to the range from the end portion of the corrected cell pattern 5 to portions affected by optical proximity effect at least. In this way, the boundary neighborhood pattern approaches the optimal shape. However, the following consideration must be given in order to make re-correction with respect to the range from the end portion of the corrected cell pattern 5 to portions affected by optical proximity effect. That is, the pattern shape must be considered in a range affected further by optical proximity effect in addition to the foregoing range. The portion to be considered is required as a buffer region for accurately determining a correction value at the boundary neighborhood. Incidentally, the optimal shape means the shape of the pattern 4 for forming a pattern of the photomask formed using a certain pattern 4 into the same shape as designed.

The mask pattern data is input to a mask lithography system. The mask lithography system forms a photomask according to the input mask pattern data (step S16). Then, a semiconductor device is manufactured using the photomask. More specifically, a material film (e.g., a conductive film to be processed into an interconnection layer) is formed above a semiconductor substrate (chip) on the way to the manufacture of the semiconductor device. Thereafter, a process film (e.g., photo resist) is formed on the material film. In an exposure system (aligner), a photomask is placed between the process film and the exposure light source. The process film is exposed by the exposure system via the photomask, and thereby, a pattern is transferred to the process film (step S17). Etching is carried out using the process film as a mask, and thereby, the material film on the semiconductor substrate is formed with the pattern (step S18).

In the method of forming the photomask according to the first embodiment, the corrected cell pattern 5 that underwent the PPC is prepared and placed. Thereafter, the PPC is again made with only boundary neighborhood pattern 4b of the corrected cell pattern 5. Therefore, the corrected cell pattern 5 is once prepared, and thereby, correction is only made with respect to boundary neighborhood pattern 4b of each corrected cell pattern 5 even if a photomask having different layout is formed later. Thus, time spent for forming the photomask is considerably shortened. As a result, time spent for the PPC is reduced to about 1/50 of the case where the PPC is made with respect to all patterns after cell patterns without the PPC are placed.

In general, the boundary neighborhood pattern of the cell pattern receives an influence by the optical proximity effect from neighboring cell patterns, specifically the boundary neighborhood pattern of the adjacent cell patterns. In order to solve the problem, the PPC is again made with only boundary neighborhood pattern 4b of the corrected cell pattern 5, as described in the foregoing embodiment. In this way, it is possible to prevent the pattern dimensions of the photomask corresponding to the boundary neighborhood from diverging from the designed pattern dimensions.

In addition, present embodiment does not need a space between cell patterns as the first prior art does, and an interposing dummy pattern between cell patterns does not needed to be provided in the embodiment as it does in the second prior art. Thus, it is possible to prevent the chip area from increasing.

In the process of making correction with respect to the boundary neighborhood pattern 4b of the corrected cell pattern 5, it is possible to consider the shape of the boundary neighborhood pattern 4b of neighboring corrected cell patterns 5. That is, if no pattern 4b exists in the boundary neighborhood portion of the neighboring corrected cell patterns 5, correction does not need to be made with respect to the boundary neighborhood pattern 4b of the correction object cell pattern 5. The following is given as one example of the case where no pattern 4b exists in the boundary neighborhood portion of the neighboring corrected cell patterns 5. That is, patterns 4b are formed at the only center of the corrected cell pattern 4b.

(Second Embodiment)

In the first embodiment, the PPC is made with respect to the cell pattern 3 of the cell library 1 itself to prepare the PPC cell library 2. In the second embodiment, the PPC is made to the cell pattern 3 of the cell library 1 having an additional pattern placed in its neighborhood.

Figure 5:
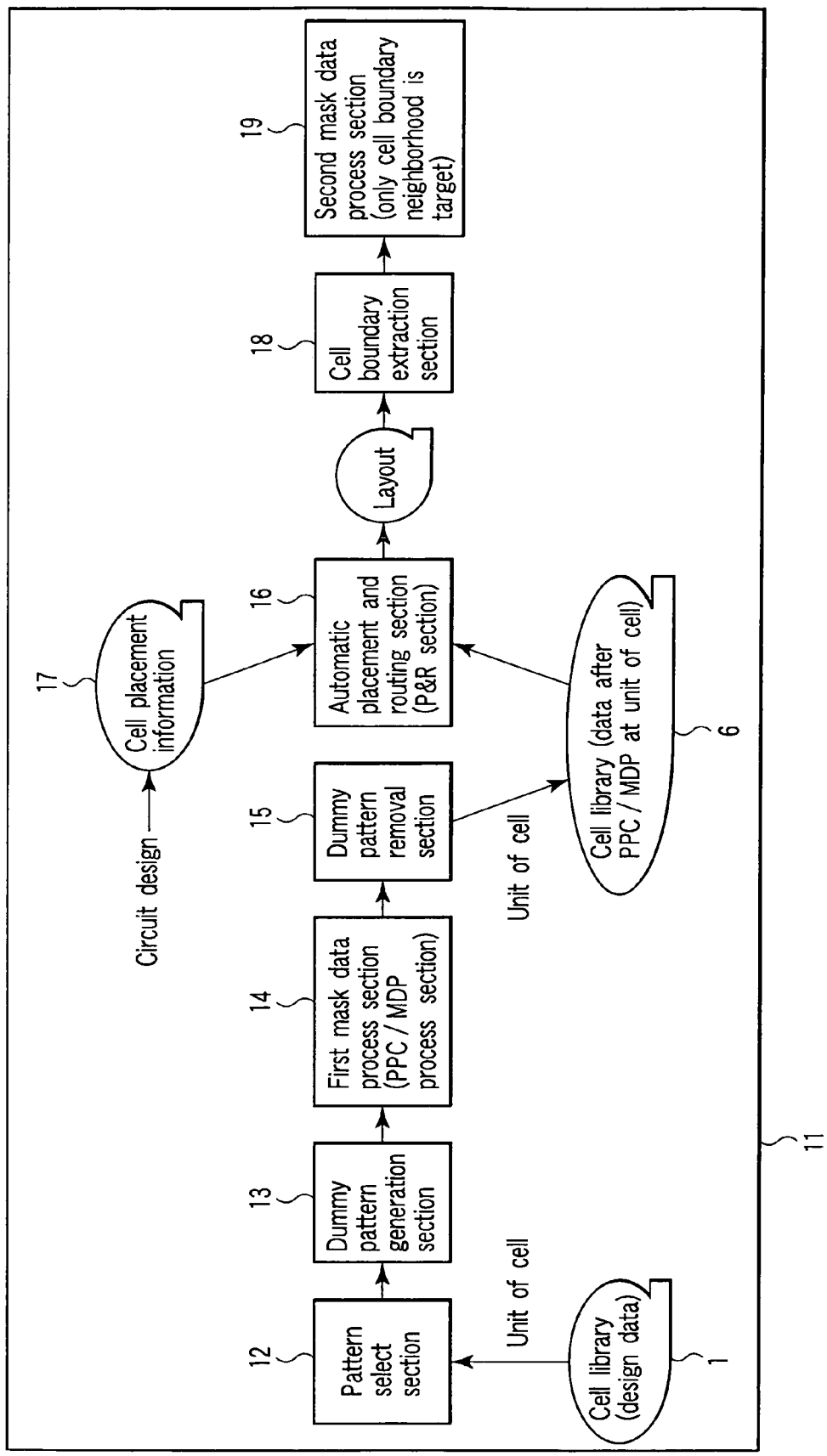
FIG. 5 is a block diagram showing the configuration of an apparatus for preparing a mask pattern data according to a second embodiment.

FIG. 5 schematically shows the configuration of a mask pattern forming system 11 according to the second embodiment. As shown in FIG. 5, the mask pattern forming system 11 has a pattern select section 12. The pattern select section 12 selects one cell pattern 3 from the cell library 1, and outputs the data of the selected cell pattern. The data from the pattern select section 12 is supplied to a dummy pattern generation section 13. The dummy pattern generation section 13 prepares data of a provisional cell pattern having a dummy pattern placed on both neighborhoods of the cell pattern 3 based on the method described later.

A first mask data process section 14 makes the PPC with respect to the provisional cell pattern according to the known mask data processing (MDP) method. As a result, the data of a corrected provisional cell pattern, which is obtained by subjecting the provisional cell pattern to the PPC, is prepared. The mask data process section 14 supplies the data of the corrected provisional cell pattern to a dummy pattern removal section 15. The dummy pattern removal section 15 removes the dummy pattern from the corrected provisional cell pattern to generate corrected cell pattern data. A PPC cell library 6 holds corrected cell pattern data generated from each cell pattern.

An automatic placement and routing section (P&R) section 16 successively places corrected cell patterns on a chip according to informations from a cell placement information storage section 17. Thereafter, the section 16 places an interconnection pattern between corrected cell patterns. As a result, layout data is formed. The cell placement information storage section 17 stores cell placement information obtained from the circuit design result.

A cell boundary extraction section 18 extracts the boundary neighborhood pattern 4b of each corrected cell pattern like the method described in the first embodiment. The data of the extracted pattern 4b is supplied to a second mask data process section 19. The second mask data process section 19 makes the PPC with respect to the extracted pattern 4b.

Figure 6:
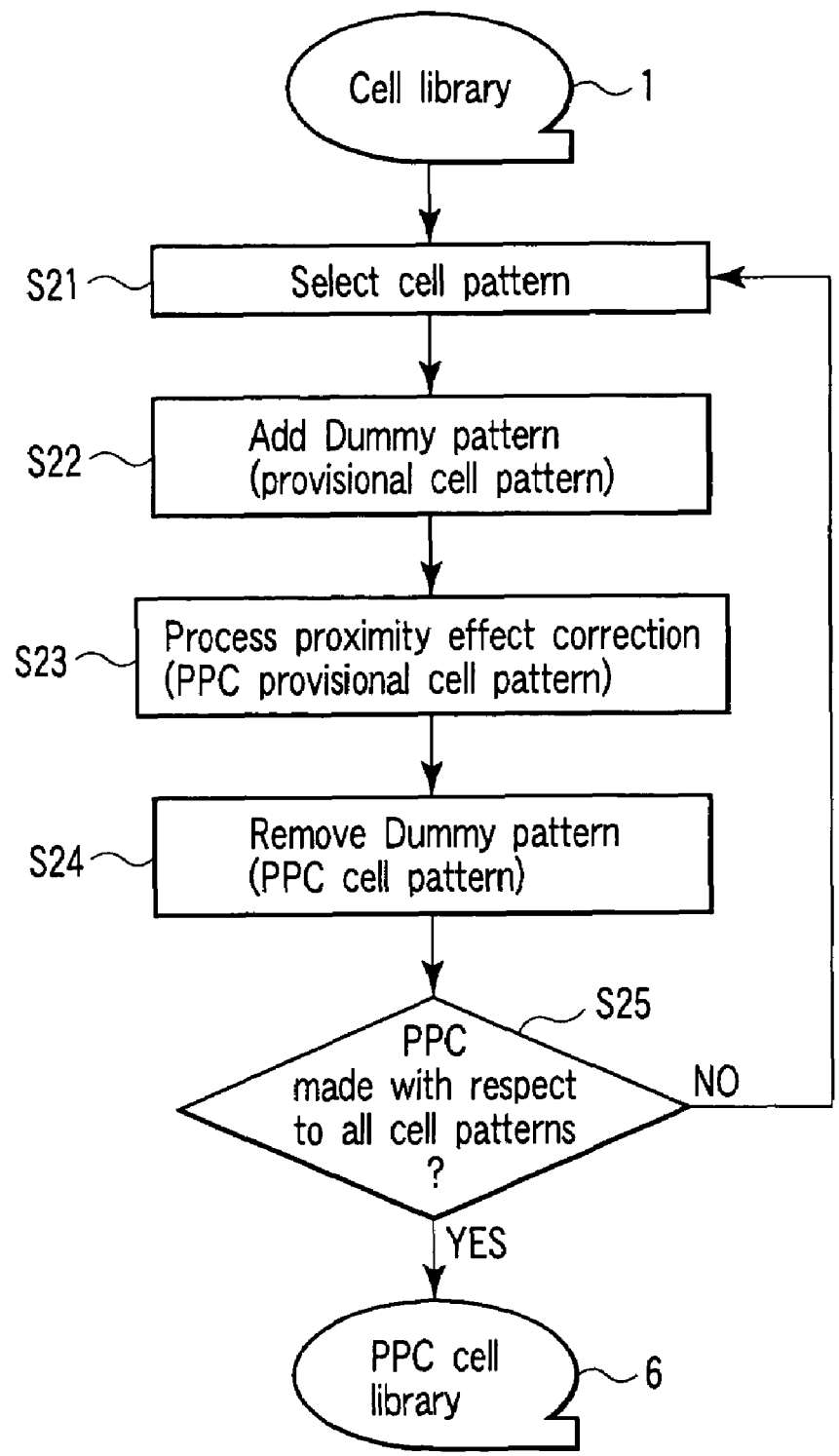
FIG. 6 is a flowchart to explain the method of preparing a cell library according to a second embodiment.

The following is an explanation about the method of preparing the PPC cell library 6 (second cell library) having corrected cell patterns subjected to the PPC. FIG. 6 is a flowchart to explain the method of preparing the PPC cell library 6. As can be seen from FIG. 6, a first cell pattern 3 is selected from the cell library 1 (step S21).

For example, a dummy pattern 21 is added to both neighborhoods of the selected cell pattern 3, and thereby, a provisional cell pattern 22 is formed (step S22). The features of the dummy pattern 21 will be described later. Then, the PPC is made with respect to the provisional cell pattern 22, and thereby, a corrected provisional cell pattern is formed (step S23). Thereafter, the dummy pattern 21 is removed from the corrected provisional cell pattern (step S24). As a result, a corrected cell pattern of the original cell pattern, which underwent the PPC with the influence by optical proximity effect from the dummy cell pattern 21 taken into consideration, is formed. The corrected cell patterns are stored in the PPC cell library.

It is determined whether or not the PPC is made with respect to all cell patterns 3 of the cell library 1 (step S25). If the PPC is not made with respect to all cell patterns 3, the operations of step S21 to S24 are repeated. The operations of step S21 to S24 are repeated, and thereafter, when it is determined that the PPC with respect to all cell patterns 3 is completed, the process of preparing the PPC cell library 6 ends.

The method of forming the photomask has the same process as the first embodiment except for the following one point. That is, in step S12 of FIG. 4, the corrected cell pattern is picked up from the PPC cell library 6 prepared according to the method described in FIG. 5.

The features, shape and placement of the dummy pattern 21 will be described below with reference to FIG. 7 and FIG. 8. When exposing the photomask in general, the formed patterns mutually receive the influence of the optical proximity effect from neighboring patterns. For this reason, when the PPC to the boundary neighborhood pattern 4b of the corrected cell pattern 5 in the first embodiment, the influence of the optical proximity may change in the boundary neighborhood pattern 4b. Thus, the optimal shape of the boundary neighborhood pattern 4b may change. In particular, if many patterns 4b exist in the boundary neighborhood of the corrected cell pattern 5 and around there, the boundary neighborhood pattern 4b of the corrected cell pattern 5 receives a large influence. To address this phenomenon, in the stage of the PPC with respect to each cell pattern 3, the influence of neighboring cell patterns is taken into consideration in advance. More specifically, the PPC is made in a state that the dummy pattern 21 is placed on both neighborhoods of the object cell pattern 3.

Preferably, the dummy pattern 21 has a shape similar to the cell pattern 3 (i.e., boundary neighborhood pattern 4) actually placed on the neighborhood considering the influence to the PPC object cell pattern 3. However, it is difficult to predict the shape of the actual neighboring cell pattern 3 in portions other than the power line pattern 4a. In general, it has been known that it is most difficult to make the PPC with respect to a densely placed pattern. For this reason, the PPC is made in a state that a dummy pattern having the most densely placed patterns is added.

Figure 7:
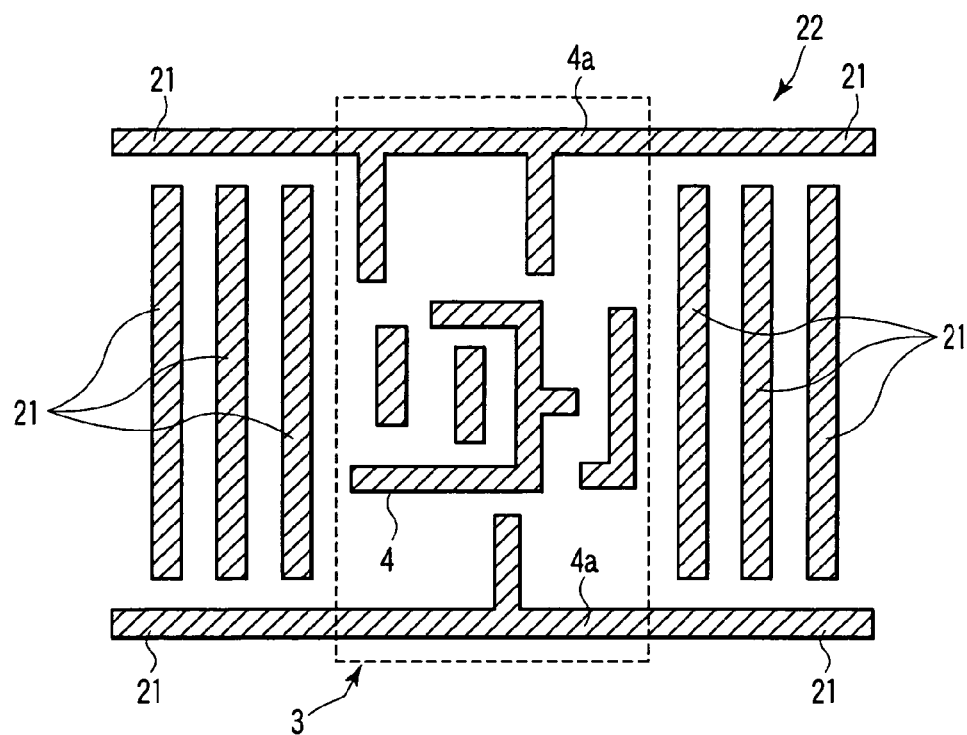
FIG. 7 is a view showing one example of a provisional cell pattern obtained by adding dummy pattern to cell pattern.

FIG. 7 shows one example of the dummy pattern added considering the reason described above. FIG. 7 shows the provisional cell pattern 22 having the dummy pattern 21, which is added to the outside (periphery) of the cell pattern 3. As can be seen from FIG. 7, the dummy pattern 21 has two kinds of patterns. One is a line and space pattern extending to the direction connecting two power lines 4a. Another is the same pattern as the power line 4a, which extend continuously from the power line 4a at upper and lower portions of the cell pattern 3.

The line and space pattern is formed in a manner that several patterns and spaces are alternately placed from both ends of the cell pattern 3 in the power line extending direction in the most nested state. The most nested state means the most micro pattern width and space in a range realizable using the technique of the stage to which the present embodiment is applied. The value of the micro pattern width and space is becoming smaller with the advance of techniques. The distance between the dummy pattern 21 nearest to the cell pattern 3 and the outermost pattern 4 of the cell pattern 3 is less than twice the minimum width between patterns 4 of the cell pattern 3. The foregoing distance may be the same as the minimum width.

The PPC is made with respect to the cell pattern 3 together with the dummy pattern 21, which is the most difficult to be corrected, and thereby, the boundary neighborhood of the corrected cell pattern 5 is readily corrected. In fact, almost no correction may be required. Therefore, it is possible to prevent the shape of the pattern 4 on the center portion from changing by the correction with respect to the boundary neighborhood of the corrected cell pattern 5.

Figure 8:
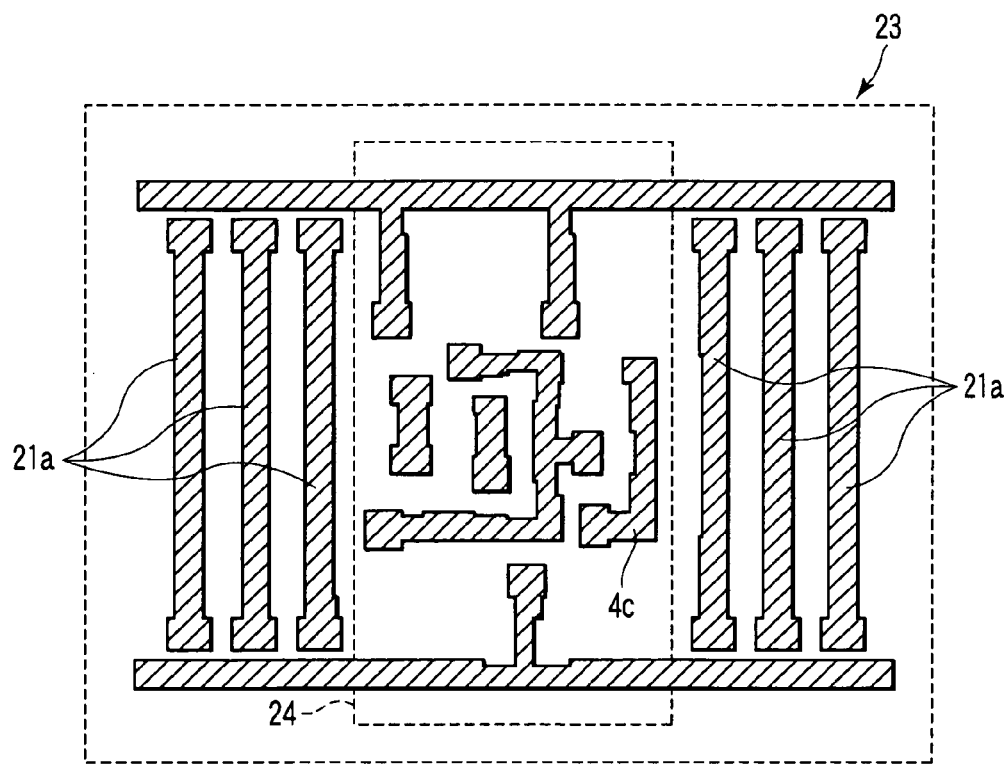
FIG. 8 is a view showing one example of a corrected provisional cell pattern obtained by subjecting provisional cell pattern to PPC.

FIG. 8 schematically shows a corrected provisional cell pattern 23 having the provisional cell pattern 22 subjected to the PPC. As seen from FIG. 8, corrected pattern 4c and PPC dummy pattern 21a are formed so that each shape of their corner and end and line width change in the same manner as the first embodiment. Portions of the provisional corrected cell pattern 23 except for the dummy pattern 21a, that is, portions surrounded by the broken line correspond to a corrected cell pattern 24. The corrected cell pattern 24 is stored in the PPC cell library 6.

The corrected pattern 4c according to the second embodiment has a shape slightly different from the correction pattern 4b according to the first embodiment. More specifically, the shape change from the pattern 4 is different between the first and second embodiments. This is because the PPC is made taking the influence of the optical proximity effect from the dummy pattern 21 into consideration.

Figure 9:
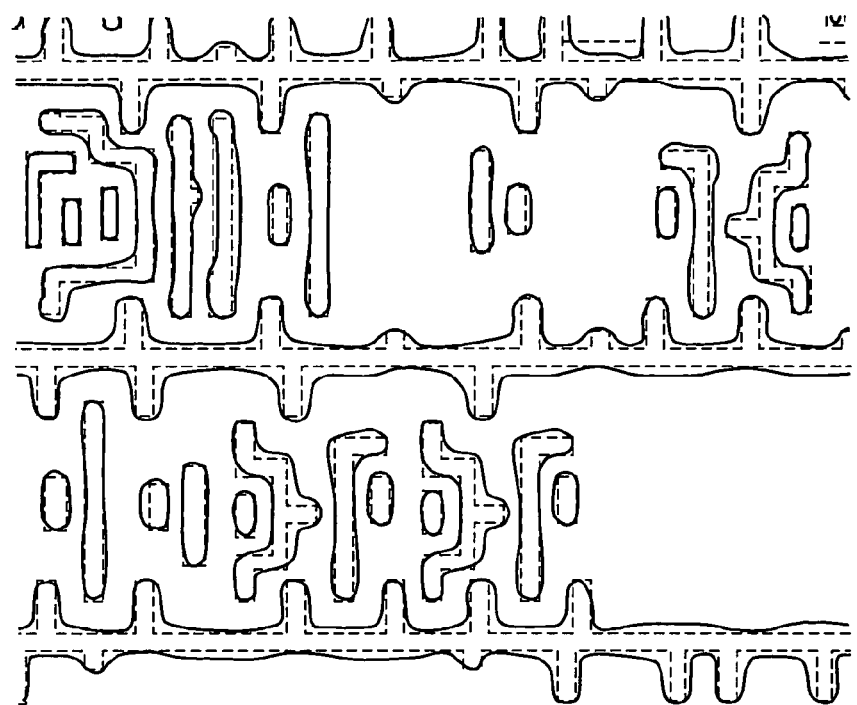
FIG. 9 is a view showing the pattern shape predicted result when a material film is exposed.

FIG. 9 shows the pattern shape predicted result when a process film is exposed using the photomask pattern data prepared according to the method of the second embodiment. In FIG. 9, the solid line shows the shape of the formed pattern; on the other hand, the broken line shows the design (desired) pattern shape. The simulation is carried out under the exposure condition having a k1 value of 0.34 taking development also into consideration. The k1 value is expressed by the following equation.

$$k1 = W/(\lambda/NA),$$

where W is the minimum line width of the pattern, NA is the lens size of the exposure system, and $\lambda$ is the wavelength of the light source of the exposure system.

In brief, when the k1 value is small, it is difficult to carry out the lithography technique, and in addition, the margin decreases in the lithography. According to other conditions, focus is in a state of shifting from the best focus by 0.15 µm, and the dose is in a state of changing from the best dose by ±5%.

According to the second embodiment, the shape of the formed pattern considerably approaches the desired pattern shape, as seen from FIG. 9.

Figure 10:
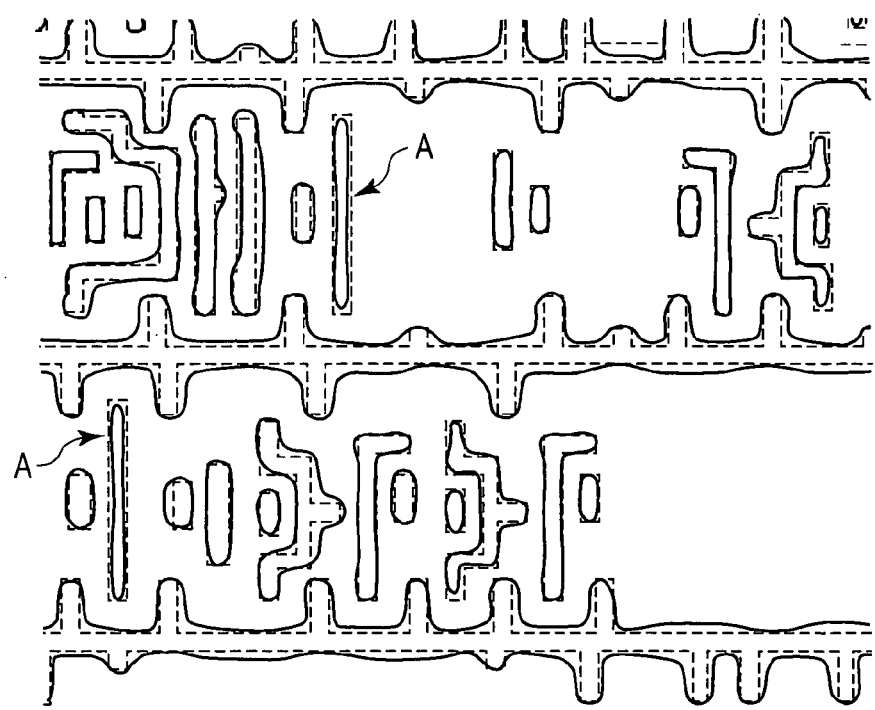
FIG. 10 is a view showing the pattern shape predicted result when a material film is exposed without making boundary correction.

As described above, the corrected cell pattern thus prepared is used, and thereby, correction does not need to be made with respect to the boundary neighborhood again. Therefore, the corrected cell pattern 24 is placed, and thereafter, no correction is made; in other words, it is possible to omit the step S14 of FIG. 4. FIG. 10 shows the pattern shape predicted result under the same condition as the simulation of FIG. 9 without the step S14. Even if the foregoing process is employed, a relatively preferable pattern shape is obtained. However, the resolution shown in FIG. 9 is not obtained. This is apparently seen from the pattern shown by the arrow A of FIG. 9. Thus, it is effective to correct the boundary neighborhood of the corrected cell pattern 24.

The procedures described in the first and second embodiments may be made by the computer using programs. In this case, procedures shown in FIG. 1, FIG. 4, FIG. 6 and each section forming the system of FIG. 5 are realized via the computer and programs for controlling the operation of the computer. More specifically, an information processing apparatus is prepared which includes an input section, central processing unit (CPU), storage section and output section. The storage section is stores programs for carrying out the procedures described in the first and second embodiments. The CPU reads the programs from the storage section, and the foregoing operation is controlled according to the programs. As a result, a mask pattern is formed from the cell pattern. The mask pattern data is output from the output section, and supplied to the exposure system.

When an optical alignment process, for example, is carried out, the mask shape (mask value) at the boundary neighborhood of the cell pattern is again corrected as described in the first and second embodiments in order to prevent degradation of the correction accuracy at the boundary neighborhood of the cell pattern. When an electron beam exposure process is employed, the electron beam exposure may be changed in the boundary neighborhood of the cell pattern and the center portion thereof without changing the mask pattern shape at the boundary neighborhood. In this way, it is also possible to prevent the degradation of dimensional accuracy in the boundary neighborhood of the cell pattern.

It is assumed in the first and second embodiments that a standard cell pattern is given as the described cell. For example, memory macro pattern and layout (physical) intellectual property (IP) may be given as the object of the present embodiments. More specifically, all layout patterns are given as the object of the present embodiments so long as degradation problem arises in the dimensional accuracy on the wafer in the boundary neighborhood of neighboring cell patterns.

All layers included in the layout pattern are given as the object of the first and second embodiments so long as degradation may occur in the dimensional accuracy in the boundary neighborhood of the cell pattern. The layers include gates, diffusion layers and contact holes, in addition to metal layer described in the second embodiment. If there is a problem in the dimensional accuracy between blocks that are placed on the chip after P&R, interconnections (upper metal layer) are given as the object of the first and second embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a mask pattern on data, comprising:
preparing a second cell library by making process proximity effect correction with respect to cell patterns stored in a first cell library, the second cell library storing corrected cell patterns, the cell patterns each being a cell pattern area which includes pattern regions for realizing individual circuit characteristics and no-pattern regions where no patterns are formed;
placing a first corrected cell pattern and a second corrected cell pattern of the corrected cell patterns so that an edge of the first corrected cell pattern and an edge of the second corrected cell pattern contact or come close to or overlap each other;
extracting a boundary pattern at the boundary neighborhood between the first corrected cell pattern and the second corrected cell pattern; and
making process proximity effect correction with respect to the boundary pattern, wherein
said preparing a second cell library includes:
forming a provisional cell pattern by placing outside and off the cell pattern area a dummy pattern that has a proximity effect on the cell pattern;
making process proximity effect correction with respect to the provisional cell pattern to form a corrected provisional cell pattern; and
removing the whole dummy pattern from the corrected provisional cell pattern.

2. The method according to claim 1, wherein said forming a provisional cell pattern includes placing the dummy pattern on a neighborhood of the cell pattern outside the cell pattern.

3. The method according to claim 2, wherein the neighborhood of the cell pattern is a range in which patterns included in the cell pattern are affected by process proximity effect from the dummy pattern.

4. The method according to claim 1, wherein the dummy pattern has a linear shape extending along an edge of the cell pattern.

5. The method according to claim 4, wherein a distance between the dummy pattern and the outermost pattern of the cell pattern is less than twice a minimum pattern width in the cell pattern.

6. The method according to claim 1, wherein said preparing a second cell library includes:
forming a provisional cell pattern by placing dummy patterns outside the cell pattern in an area within which the patterns included in the cell pattern are affected by process proximity effect;
forming a corrected provisional cell pattern by making process proximity effect correction with respect to the provisional cell pattern; and
removing the dummy patterns from the corrected provisional cell pattern.

7. The method according to claim 6, wherein the dummy patterns have a linear shape extending along an edge of the cell pattern with a space of a first distance provided between adjacent two of them, and a width of the dummy pattern and the first distance are less than twice the minimum pattern width in the cell pattern.

8. The method according to claim 7, wherein a distance between the dummy pattern nearest to the cell pattern and the outermost pattern of the cell pattern is less than twice the minimum pattern width in the cell pattern.

9. A method of manufacturing a semiconductor device comprising:
forming a photomask using the mask pattern formed by the method of forming a mask pattern on data according to claim 1; and
exposing a process film formed above a semiconductor substrate on the way to a manufacture of semiconductor device using the photomask.

10. A system forming a mask pattern on data, comprising:
a pattern select section selecting a selected cell pattern from cell patterns stored in a first library, the cell patterns each being a cell pattern area which includes pattern regions for realizing individual circuit characteristics and no-pattern regions where no patterns are formed;
a dummy pattern generation section placing outside and off the cell pattern area of the selected cell pattern a dummy pattern that has a proximity effect on the cell pattern, thereby forming a provisional cell pattern;
a first process proximity effect correction section making process proximity effect correction with respect to the provisional cell pattern, thereby forming a corrected provisional cell pattern;
a pattern removal section removing the whole dummy pattern from the corrected provisional cell pattern, thereby preparing a corrected cell pattern;
a placement and routing section placing a first corrected cell pattern and a second corrected cell pattern included in a second library storing a plurality of the corrected cell patterns so that an edge of the first corrected cell pattern and an edge of the second corrected cell pattern contact or come close to or overlap each other;
a boundary extraction section extracting a boundary pattern at the boundary neighborhood between the first corrected cell pattern and the second corrected cell pattern; and a second process proximity effect correction section making process proximity effect correction with respect to the boundary pattern.

11. A cell library comprising:
data of cell patterns, the cell patterns including corrected patterns, the cell patterns each being a cell pattern area which includes pattern regions for realizing individual circuit characteristics and no-pattern regions where no patterns are formed, the corrected patterns being obtained by making process proximity effect correction to a pattern having a shape to be transferred to a photomask, the corrected patterns having a shape corresponding to the result of process proximity effect correction considering an influence by a dummy pattern provisionally placed outside and off the cell pattern area.

12. A method of forming a photomask comprising:
forming a photomask using the mask pattern formed by the method of forming a mask pattern according to claim 1.

13. A computer program encoded in a computer-readable storage medium, the computer program, when executed by a computer, causing the computer to perform a method comprising:
preparing a second cell library by making process proximity effect correction with respect to cell patterns stored in a first cell library, the second cell library storing corrected cell patterns, the cell patterns each being a cell pattern area which includes pattern regions for realizing individual circuit characteristics and no-pattern regions where no patterns are formed;
placing a first corrected cell pattern and a second corrected cell pattern of the corrected cell patterns to that an edge of the first corrected cell pattern and an edge of the second corrected cell pattern contact or come close to or overlap each other;
extracting a boundary pattern at the boundary neighborhood between the first corrected cell pattern and the second corrected cell pattern; and
making process proximity effect correction with respect to the boundary pattern, wherein
said preparing a second cell library includes:
forming a provisional cell pattern by placing outside and off the cell pattern area and dummy pattern that has a proximity effect on the cell pattern;
making process proximity effect correction with respect to the provisional cell pattern to form a corrected provisional cell pattern; and
removing the whole dummy pattern from the corrected provisional cell pattern.

* * * * *